(12) United States Patent
Zhang et al.

(10) Patent No.: US 10,103,054 B2
(45) Date of Patent: Oct. 16, 2018

(54) COUPLED VIAS FOR CHANNEL CROSS-TALK REDUCTION

(71) Applicant: INTEL CORPORATION, Santa Clara, CA (US)

(72) Inventors: Zhichao Zhang, Chandler, AZ (US); Zhiguo Qian, Chandler, AZ (US); Tolga Memioglu, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1021 days.

(21) Appl. No.: 13/802,011

(22) Filed: Mar. 13, 2013

(65) Prior Publication Data

US 2014/0268614 A1    Sep. 18, 2014

(51) Int. Cl.
*H05K 7/10* (2006.01)
*H05K 7/12* (2006.01)
(Continued)

(52) U.S. Cl.
CPC ...... *H01L 21/768* (2013.01); *H01L 23/49822* (2013.01); *H01L 23/50* (2013.01);
(Continued)

(58) Field of Classification Search
CPC .............. H05K 1/0245; H05K 1/0216; H05K 1/114–1/144; H05K 3/108; H01L 23/5226
(Continued)

(56) References Cited

U.S. PATENT DOCUMENTS 6,388,890 B1 * 5/2002 Kwong ................ H05K 1/112
                                                   174/255
7,013,452 B2 * 3/2006 Baras ................. H05K 1/0216
                                                   333/128
(Continued)

FOREIGN PATENT DOCUMENTS

CN           10229040 A    12/2011

OTHER PUBLICATIONS

First Office Action from the Chinese Patent Office dated Apr. 18, 2016 for Chinese Patent Application No. 201410089910.1.
(Continued)

*Primary Examiner* — Tuan T Dinh
(74) *Attorney, Agent, or Firm* — Schwabe, Williamson & Wyatt, P.C.

(57) ABSTRACT

Capacitively coupled vertical transitions are configured with a desired amount of mutual capacitance to at least partially cancel crosstalk for an overall channel crosstalk (e.g., FEXT) reduction. In embodiments, capacitive coupling of adjacent vertical transitions is achieved with overlapping metal surfaces within the vertical transitions. In embodiments, one or more of the overlapping metal surfaces are vias, via pads, or metal stub features extending off a vertical transition. In embodiments, signal paths with overlapped vertical transitions are utilized to achieve crosstalk reduction of more than one victim-aggressor pair and/or to achieve crosstalk reduction of more than two aggressors. In embodiments, capacitively coupled vertical transitions are implemented in a package substrate, an interposer, or a printed circuit board.

14 Claims, 6 Drawing Sheets

(51) Int. Cl.
H01L 21/768 (2006.01)
H05K 1/02 (2006.01)
H01L 23/498 (2006.01)
H01L 23/50 (2006.01)

(52) U.S. Cl.
CPC .. H05K 1/0228 (2013.01); *H01L 2224/16235* (2013.01); *H01L 2924/15311* (2013.01); *H05K 1/0251* (2013.01); *H05K 1/0298* (2013.01)

(58) Field of Classification Search
USPC .................. 361/767–777, 803; 174/259–268
See application file for complete search history.

(56) References Cited

U.S. PATENT DOCUMENTS

| | | | | |
|---|---|---|---|---|
| 7,501,586 B2 * | 3/2009 | Wig | ...................... | H05K 1/0216 174/262 |
| 7,583,513 B2 * | 9/2009 | Boggs | .................. | H05K 1/0268 174/264 |
| 7,633,766 B2 * | 12/2009 | Regnier | ............... | H05K 1/0222 174/261 |
| 7,687,391 B2 * | 3/2010 | Harvey | ............. | H01L 23/49827 257/758 |
| 7,897,880 B1 * | 3/2011 | Goergen | .............. | H05K 1/0237 174/261 |
| 8,643,184 B1 * | 2/2014 | Zhang | ..................... | H01P 3/081 257/690 |
| 2005/0063166 A1 | 3/2005 | Boggs et al. | | |
| 2005/0133257 A1 * | 6/2005 | Lauffer | ................ | H05K 1/0216 174/262 |
| 2005/0191785 A1 * | 9/2005 | Howard | ........... | H01L 23/49827 438/106 |
| 2006/0081397 A1 * | 4/2006 | Enchi | ..................... | H05K 1/165 174/260 |
| 2006/0145805 A1 * | 7/2006 | Kim | .................... | H01F 17/0006 336/200 |
| 2008/0220565 A1 | 9/2008 | Hsu et al. | | |
| 2010/0182105 A1 * | 7/2010 | Hein | ...................... | H01P 3/003 333/239 |
| 2011/0083881 A1 * | 4/2011 | Nguyen | ................ | H05K 3/108 174/250 |
| 2011/0309468 A1 | 12/2011 | Oh et al. | | |
| 2013/0056255 A1 * | 3/2013 | Biddle | ................ | H05K 1/0245 174/266 |
| 2013/0235542 A1 * | 9/2013 | Song | ...................... | H01P 1/047 361/773 |
| 2014/0264907 A1 * | 9/2014 | Altunyurt | ........... | H01L 23/5226 257/774 |

OTHER PUBLICATIONS

First Office Action (8 pages) from the Chinese Patent Office dated Apr. 18, 2016 for Chinese Patent Application No. 201410089910.1 and English Translation (11 pages) thereof.
Notice of Allowance (2 pages) from the Chinese Patent Office dated Dec. 15, 2016 for Chinese Patent Application No. 201410089910. and English Translation (1 page) thereof.

* cited by examiner

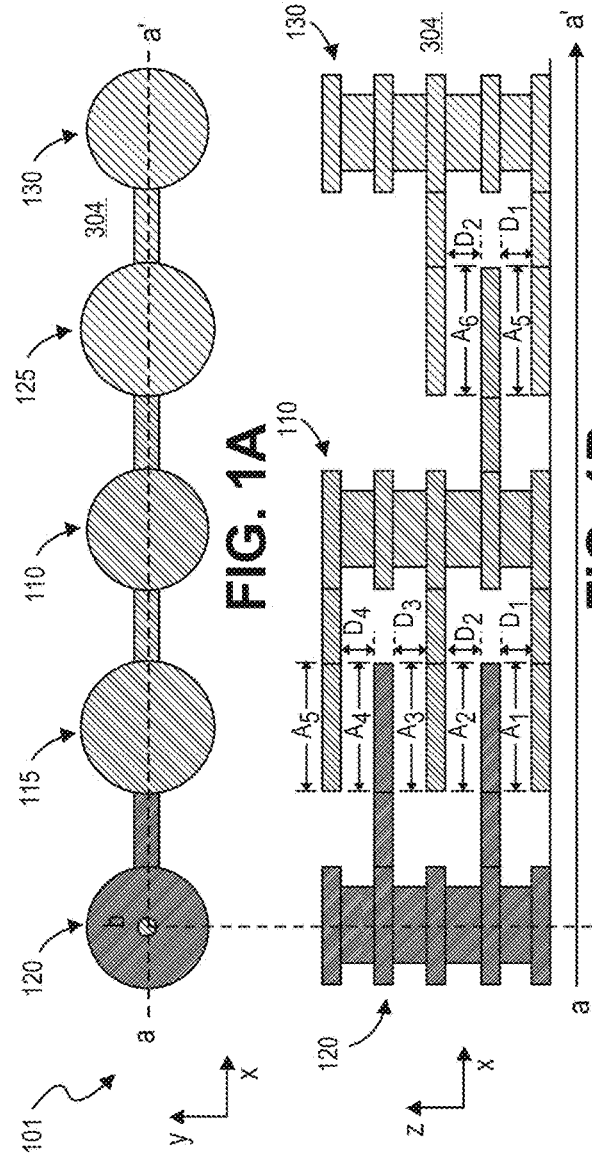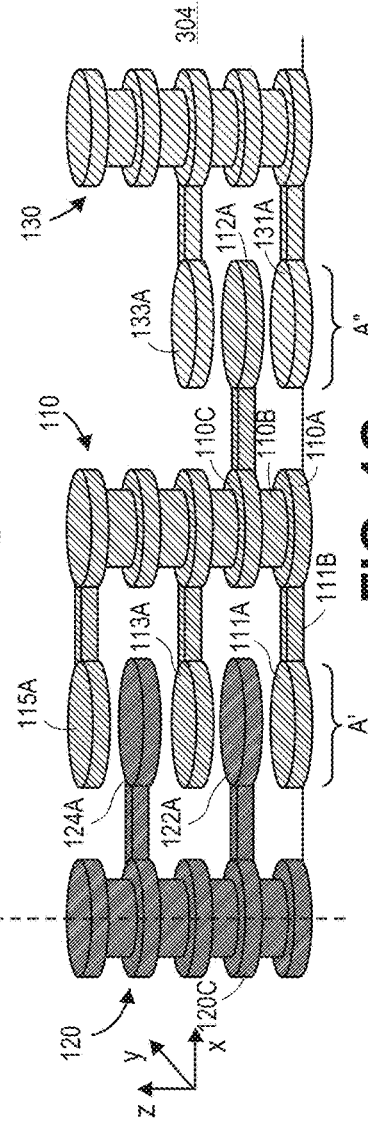

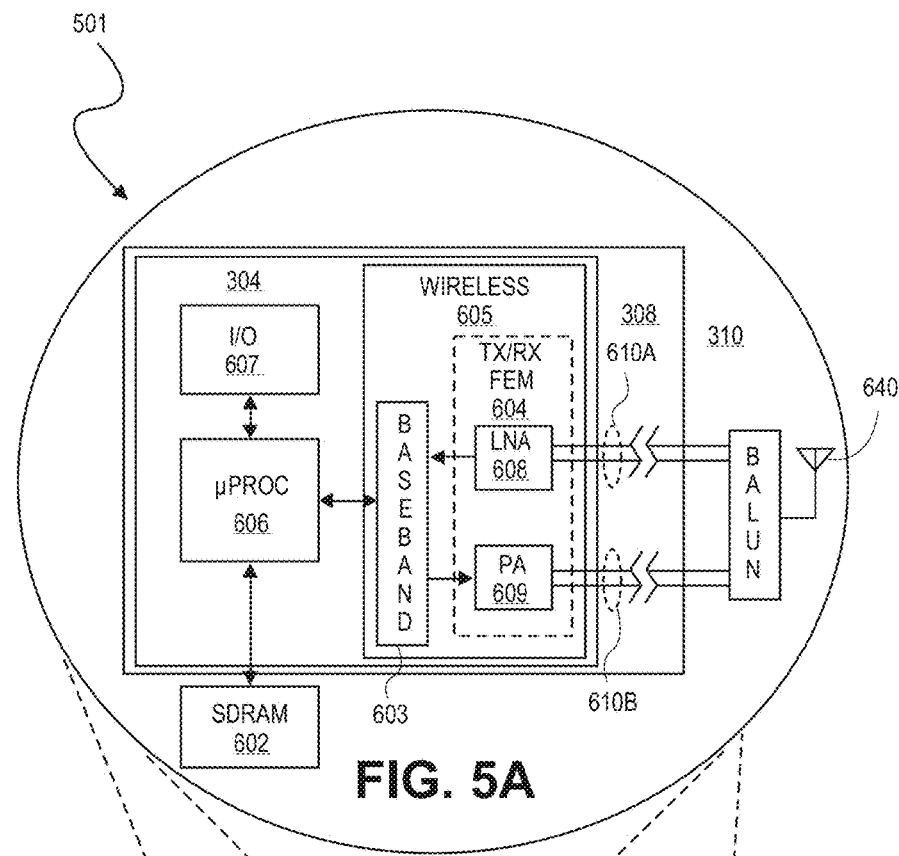
FIG. 5A
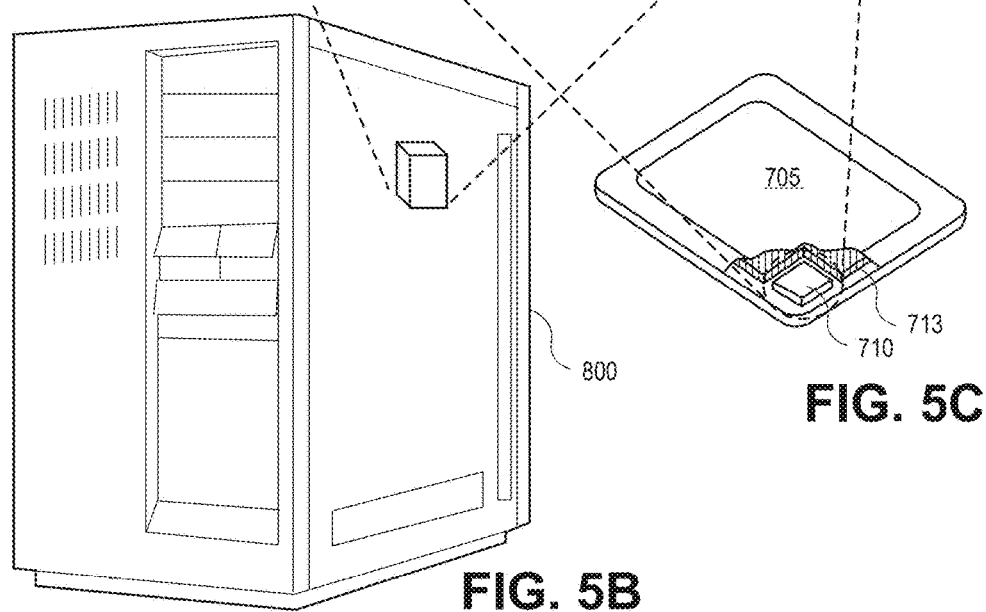
FIG. 5B
FIG. 5C

COUPLED VIAS FOR CHANNEL CROSS-TALK REDUCTION

TECHNICAL FIELD

Embodiments of the present invention generally pertain to integrated circuits (IC), and more particularly to paths for conveying integrated circuit I/O channels off-chip.

BACKGROUND

High speed signaling poses significant challenges with respect to signal loss between an IC operable within a high frequency range, and off-chip terminals, such as a dynamic random access memory (DRAM) interface, or an antenna for wireless applications. The cumulative path of a signal channel between the IC chip and off-chip signal origin/designation generally includes a package of the IC, and may further include an interposer on which the IC is affixed, and/or a circuit board on which the IC or interposer is affixed. Horizontal interconnect routing for a given communication channel in the IC package, and/or interposer, and/or board responsible for carrying such high speed signals may include a transmission line circuit for containing the electromagnetic wave as it is propagated. Such transmission lines are often in the form of a stripline, microstrip, or coplanar waveguide (CPW) circuit. Vertical interconnect routing for a given channel may include, for example, plated through holes and micro vias in a package substrate, socket pins/lands, and plated through holes in a motherboard.

Crosstalk between channels occurs when a signal transmitted on one channel of a transmission system creates an undesired effect in another channel and may be caused by one or more of capacitive, inductive, or conductive coupling between the channels. Interference between two channels as measured at an end of a path opposite from that of the transmitter is referred to as far end crosstalk (FEXT) and, assuming proper termination and non-interleave routing, is typically more problematic than near end crosstalk (NEXT) measured at the transmitter end of the path. Overall channel crosstalk, which is often predominantly FEXT, remains a problem in high data bandwidth applications (e.g., exceeding 2.0 Gbyte/sec), and can be the bandwidth limiter, particularly for single-ended channels.

Crosstalk from vertical transitions and horizontal microstrip routing are often both inductively dominant. As such, to maintain acceptable I/O performance, conventional I/O channel architectures may either employ conservative signal to ground (S:G) ratios in vertical transitions and/or stripline architectures in horizontal routing to mitigate crosstalk. Such techniques however disadvantageously increase pin count and layer count, respectively.

BRIEF DESCRIPTION OF THE DRAWINGS

Embodiments of the present invention are illustrated by way of example, and not limitation, in the figures of the accompanying drawings in which;

FIGS. 1A, 1B, and 1C illustrate plan, cross-sectional, and isometric views of overlapping vertical transitions employed in I/O signal routing paths to tune capacitive coupling of channels susceptible to crosstalk, in accordance with an embodiment of the present invention;

FIG. 5A is a functional block diagram of a system employing signal lines with overlapping vertical transitions to reduce signal transmission crosstalk, in accordance with an embodiment;

FIG. 5B is an isometric view of a server machine employing the system of FIG. 5A, in accordance with an embodiment; and FIG. 5C is an isometric view of a mobile computing device employing the system of FIG. 5A, in accordance with an embodiment.

DETAILED DESCRIPTION

Figure 2A:
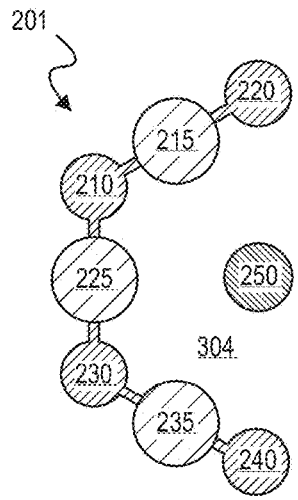
FIGS. 2A, 2B, 2C, 2D, and 2E illustrate plan views of vertical transitions for separate I/O channels and capacitively coupled areas, in accordance with embodiments of the present invention.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Generally, embodiments described herein achieve a reduction in overall crosstalk between I/O channels of an IC through a cancellation technique in which mutual capacitive coupling of adjacent vertical transitions in off-chip routing and its ratio to self capacitive coupling are increased. As one example, decomposition of a DDR4 channel implemented by an IC chip indicates an interposer between the chip and a host board, board socket to interposer, and the DIMM connector on the board hosting a DRAM memory chip are all significant crosstalk contributors, particularly FEXT. IC I/O channels may be either single-ended or differential pairs with typically over one half of the I/Os for many ICs, including certain DDR implementations, being single-ended. As such, a single-ended link is employed in exemplary embodiments, but the similar structures and techniques can also be applied to differential signal links. FEXT for any single-ended channel is a function of the mutual capacitive and inductive coupling:

$$FEXT \propto \frac{C_m}{C} - \frac{L_m}{L},$$

where $C_m$ is the mutual capacitance, C is the self-capacitance, $L_m$ is the mutual inductance and L is the self-inductance. Vertical transitions in a substrate, such as a package substrate, other interposer, or printed circuit board, are usually implemented with micro-vias or mechanically drilled plated through hole (PTH) vias. The crosstalk of these vertical transitions is inductively dominant such that FEXT is less than zero. This may also be true for transmission lines, such as a microstrip, employed in the channel along horizontal transitions/routes. Therefore, in the time domain the overall channel FEXT often has negative polarity (i.e., negative for a rising edge excitation).

The ratio of the mutual capacitance over the self-capacitance ($C_m/C$) associated with certain vertical transmissions may be tuned to have a positive polarity for a rising edge excitation. Because the channel FEXT can be treated as the cumulative effect from all components, vertical transitions may be configured with a desired amount of mutual capacitance relative to self-capacitance to partially, completely or overly compensate crosstalk for an overall channel crosstalk reduction. For example, changing certain vertical transitions from inductive to capacitive dominant (i.e., changing polarity) may help to cancel inductive dominant FEXT from other channel components, such as, but not limited to a motherboard via or microstrip routing. Increased mutual capacitance of adjacent vertical transitions achieved by embodiments herein may therefore enable higher I/O density by reducing the number of ground pins (e.g., within byte and/or cross-byte isolation pins), or enable a layer count reduction in the substrate by permitting the use of microstrip routing for horizontal transitions rather than stripline routing or other similarly more layer intensive transmission line designs. Alternatively, or in addition, higher channel data rates, and/or greater voltage or time margin may be achieved with embodiments.

In embodiments, capacitive coupling of adjacent vertical transitions is tuned by introducing overlapping metal surfaces within the vertical transitions. FIGS. 1A, 1B, and 1C illustrate plan, cross-sectional, and isometric views of a plurality of overlapping vertical transitions 101 employed to reduce signal transmission crosstalk between in a plurality of I/O signal routing paths, in accordance with an embodiment of the present invention. Such overlapping metal areas within vertical transitions may, for example, be utilized to pass through a thickness of one or more of: a package substrate to which an IC chip is affixed, an interposer to which a package substrate or an IC chip is affixed, or a PCB to which a package substrate, an IC, or an interposer is affixed.

As shown in FIGS. 1A-1C, the plurality of overlapping vertical transitions 101 include a first, second, and third vertical transitions, 110, 120, and 130. Although in the exemplary embodiments, each of the vertical transitions 110, 120, and 130 entail stacked vias with features aligned strictly vertical (e.g., along axis b), staggered vias are also suitable vertical transitions for embodiments herein. In the exemplary embodiment, the vertical transitions 110, 120, and 130 form a single row with each having a centers on the a-a' plane. However, a vertical transition may also be adjacent to one or more other vertical transition such that three or more vertical transitions do not fall on a straight line. Between the vertical transitions 110 and 120 is a first coupler 115 and between the vertical transitions 120 and 130 is a second coupler 125. Each of the couplers 115, 125 are associated with two or more metal surfaces, one of the surfaces electrically connected to a first vertical transition (e.g., transition 110) and the other electrically connected to a second vertical transition (e.g., transition 120) to effectively form substantially parallel plates with a dielectric disposed there between (i.e., a stacked parallel plate capacitor).

As shown in FIG. 1C, the first vertical transition 110 includes a metal patch, or stub, 111A extending off a via pad 110A. As shown in FIGS. 1B and 1C, the metal patch 111A has a metal surface occupying a first area A' of the substrate 304 at a first interconnect level. The second vertical transition 120 includes a metal patch 122A extending off a via pad 120C. The metal patch 122A has a metal surface occupying a second area of the substrate at a second interconnect level adjacent to (above) the interconnect level of the metal patch 111A. The first and second metal surface areas 111A and 122A overlap to occupy a first overlapped area $A_1$ of the substrate. As further illustrated in FIG. 1B, the metal patches 111A and 122A are separated by space $D_1$ filled with an intervening dielectric. The coupler 115 therefore has a mutual capacitance dependent on the size of the metal surface overlap area $A_1$, the distance between the metal surfaces $D_1$, and permittivity of material in between The overlap $A_1$ may vary widely, for example anywhere between one and four times the area of a via pad. Therefore, where not otherwise constrained, the metal patches 111A, 122A may be hundreds of microns in diameter. With any non-zero area however, the coupler 115 will boost mutual capacitance of the first and second vertical transitions 110, 120. Depending on the embodiment, this boost in mutual capacitance may be utilized to reduce FEXT of a complete vertical transition (e.g., including a package PTH, a socket, and a PCB PTH), or to overcompensate the FEXT of at least one component in the vertical transition (e.g., a package PTH) with polarity reversal to cancel crosstalk from other components of the channel (e.g., horizontal transitions employing microstrip routing on a PCB).

In exemplary embodiments wherein a plurality of signal paths include a pair of signal lines which have an aggressor-victim crosstalk relationship, the coupler 115 is utilized for crosstalk cancellation by passing a first of the signal lines through a substrate using the first vertical transition 110 and a second of the signal lines through the substrate using the second vertical transition 120. The overlap area and the number of adjacent metal surfaces (i.e., layer count) may be optimized/tuned based on the aggressor-victim crosstalk relationship to boost mutual capacitance of an aggressor-victim pair with little or no adverse impact on other electrical metrics and without any manufacturing process modifications. Notably, design and/or validation rules would ordinarily forbid such vertical transition overlap, but this is remedied with a minor change to channel path netlist-related rules.

As depicted in FIGS. 1A-1C, the first vertical transition 110 comprises a metal patch 113A with a third metal surface occupying a third area of the substrate at a third interconnect level. The metal patch 113A is electrically connected to the vertical transition 110 by a stub connector 111B extending from a via pad 110A that is further connected to another via pad 110C by way of the metal filled via 110B. The metal patch 113A is adjacent to the metal patch 122A formed in the second interconnect level and on a side opposite the first metal patch 111A. This third metal surface has an overlap of area $A_2$, which further overlaps at least a portion of the first overlapped area, $A_1$, to increase the effective overlapped surface area of the coupler 115 (e.g., providing fourth metal patch 124A having overlapped area $A_4$ and fifth metal patch 115A having overlapped area $A_5$). Notably, although in the exemplary stacked via embodiment, all the metal patches 111A-115A overlap to occupy a same area of the substrate (i.e., form a vertical stack of interdigitated capacitor plates coupling a first pair of I/O signal paths), the various metal coupling patches may be positioned out of vertical alignment with corresponding features in other interconnect levels, for example to accommodate staggered via structures or other routing limitations, or merely as another means of tuning the mutual capacitance. For such embodiments, a subset of metal surfaces will overlap a first area of the substrate while another subset of metal surfaces overlaps a second area of the substrate.

In embodiments, signal paths with overlapped vertical transitions are utilized to achieve crosstalk reduction in more than one victim-aggressor pair. As further shown in FIGS. 1A-1C, the first vertical transition 110 is also adjacent to the third vertical transition 130. In embodiments, the third vertical transition 130 is part of an I/O channel path forming a second crosstalk victim-aggressor pair with the I/O channel associated with the vertical transition 110. A second coupler 125 disposed between the vertical transitions 110 and 130 provides desired mutual capacitance between the channel paths incorporating the first and third vertical transitions 110, 130 by a metal patch 131A with a fourth metal surface occupying a fourth area of the substrate A" that is overlapped by the metal patch 112A. Additional interconnect levels may be utilized to provide more coupling area (e.g., metal patch 133A), as previously described. As shown, the capacitance of second coupler 125 may be tuned independently of that of the first coupler 115.

In embodiments, overlapped vertical transitions are utilized to achieve crosstalk reduction of more than two aggressors. Notably, unlike techniques employing transmission lines in horizontal runs that rely on edge-based schemes (e.g., stubby line, etc.), the vertical transition embodiments described herein can achieve crosstalk tuning/cancellation of more than two aggressors through three-dimensional structures (large parallel 2D coupling surfaces disposed along the vertical transition in the third dimension). FIGS. 2A, 2B, 2C, 2D, and 2E illustrate this capability with plan views of I/O channel pin layouts with corresponding capacitively coupled areas, in accordance with embodiments of the present invention.

As shown in FIG. 2A, the routing 201 includes vertical transitions 210, 220, 230 and 240 for four single-ended I/O channels, and another vertical transition 250 for a ground line (other grounds for byte-to-byte isolation are omitted for clarity). In this bowtie pattern, a channel has no more than two direct aggressors (e.g., the channel associated with transition 210 forms a crosstalk aggressor-victim pair with the channel associated with the transition 220 as well as with the channel associated with the transition 230). Between each adjacent pair of transitions is a coupling area (e.g., 215, 225, 235) including metal features from adjacent interconnect layers disposed over overlapping areas of the substrate 304. Thus, a coupling area having an independently tuned mutual capacitance is provided between each aggressor-victim pair. Notably, the coupling areas 215, 225, 235 can be arranged in any angle for the sake of packing density, manufacturing limitations, etc.

Figure 2B:
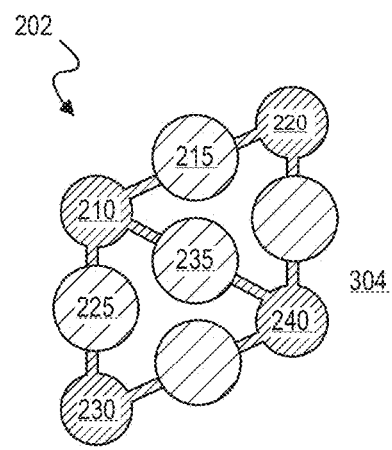

In FIG. 2B, routing 202 includes vertical transitions 210, 220, 230 and 240 for four single-ended I/O channels. This "eye" pattern layout may introduce three aggressors to one or more victim channel. For example, the channels associated with the transition 210 may be a victim of crosstalk from any of the three channels associated with the vertical transitions 220, 230, or 240. As further shown in FIG. 2B, coupling areas 215, 225 and 235 may each be implemented with first metal interconnect features electrically connected to the vertical transition 210 and with second metal interconnect features separately electrically connected to one of the vertical transitions 220, 230, and 240, respectively. This arrangement also provides a 1:1 correspondence between coupling areas and victim-aggressor pairs for independent crosstalk cancellation/capacitive coupling tuning.

Figure 2C:
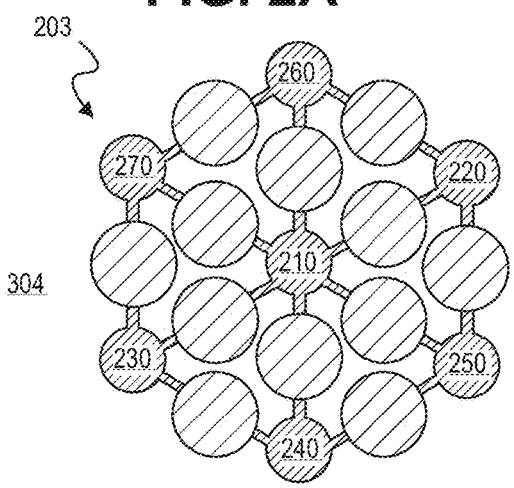
Figure 2D:
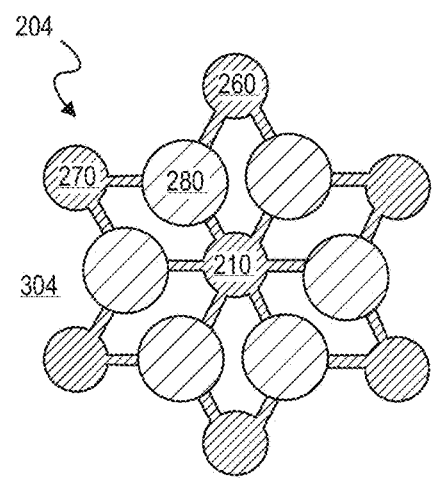
Figure 2E:
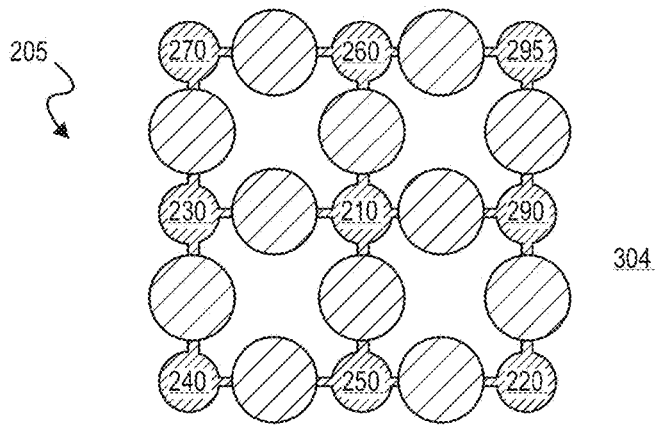

In FIGS. 2C and 2D, routings 203 and 204 are both "hexagonal" patterns capable of high signal-to-ground line (S:G) ratios, but with a maximum of six aggressors (e.g., 220, 230, 240, 250, 260, 270) possible for the channel associated with the vertical transition 210. These repetitive, highly symmetric patterns may be extended to an entire pin field. Theoretically, no ground pins are needed for isolation purposes if ideal crosstalk reduction can be achieved through the coupling areas alone. As such, substrate area consumed by the coupling areas can be offset by a reduction in area dedicated to ground isolation. While FIG. 2C illustrates an embodiment with 1:1 mapping between capacitive coupling areas and adjacent victim-aggressor pairs, FIG. 2D illustrates a more compact form employing shared capacitive coupling areas. For example the shared coupling area 280 includes metal features of different interconnect layers, each electrically connected on one of the vertical transitions 210, 260, and 270. The embodiment 204 occupies less substrate area than the 1:1 mapping in FIG. 2C, but reduces the degrees of freedom for cancellation through mutual capacitance. As such, the routing 204 is advantageous where aggressive coupling is not needed.

Notably, while all the embodiments depicted in FIGS. 2A, 2B, 2C, and 2E entail hexagonal patterns (or subsets thereof) having a uniform pitch, the same principle can be extended to square patterns, or other uniform, or non-uniform patterns. For example, FIG. 6 illustrates one exemplary embodiment where the routing 205 includes nine vertical transitions (210, 220, 230, 240, 250, 260, 270, 290, and 295), each associated with nine separate I/O channels with no grounds depicted. A 1:1 coupling area-to-victim-aggressor pair is maintained for the square layout.

Figure 3A:
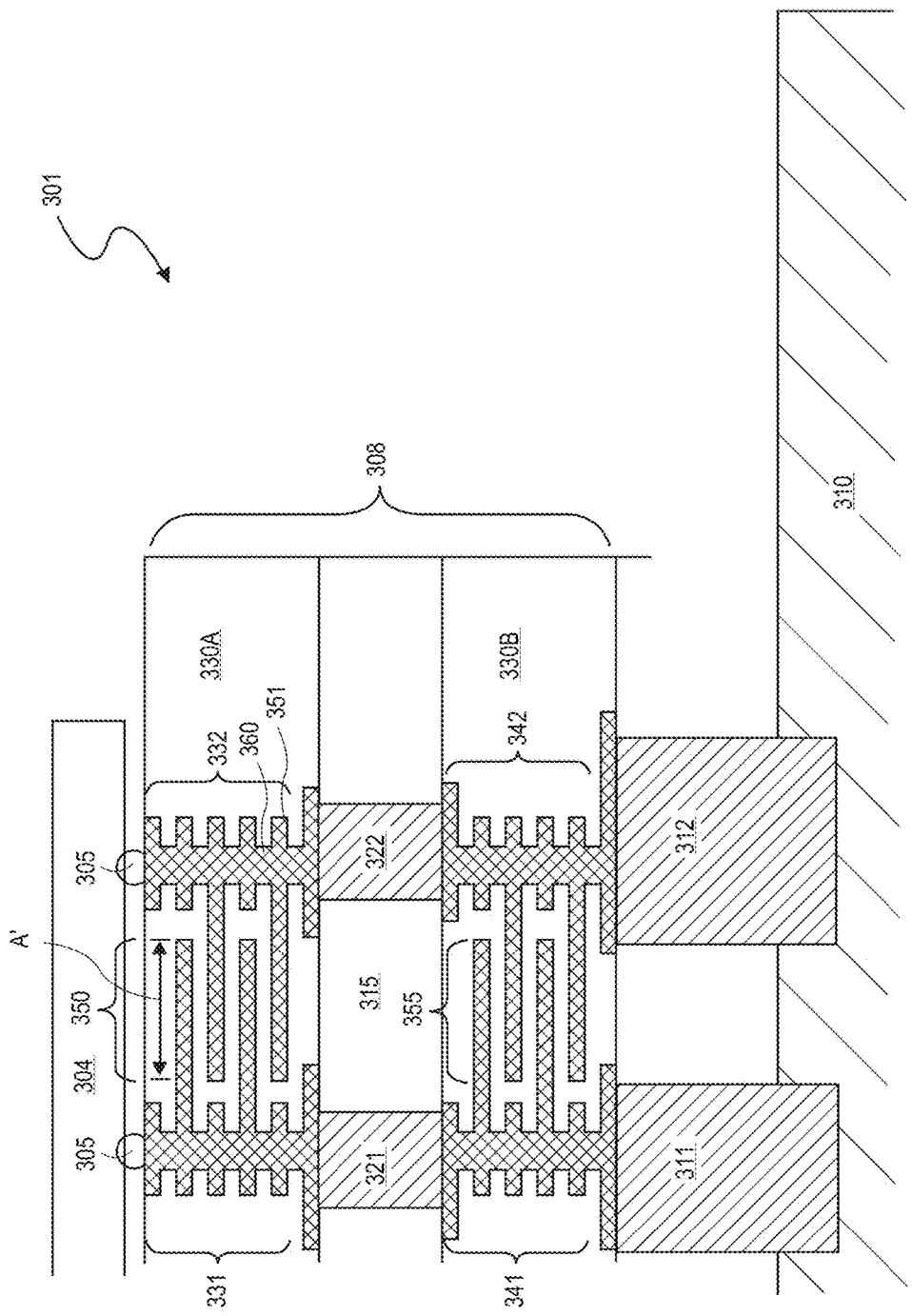
FIGS. 3A and 3B are cross-sectional views of systems including an integrated circuit (IC) chip interfacing to a package substrate further interfacing to an interposer or board, and illustrating vertical transitions forming part of an I/O channel, in accordance with embodiments.
Figure 3B:
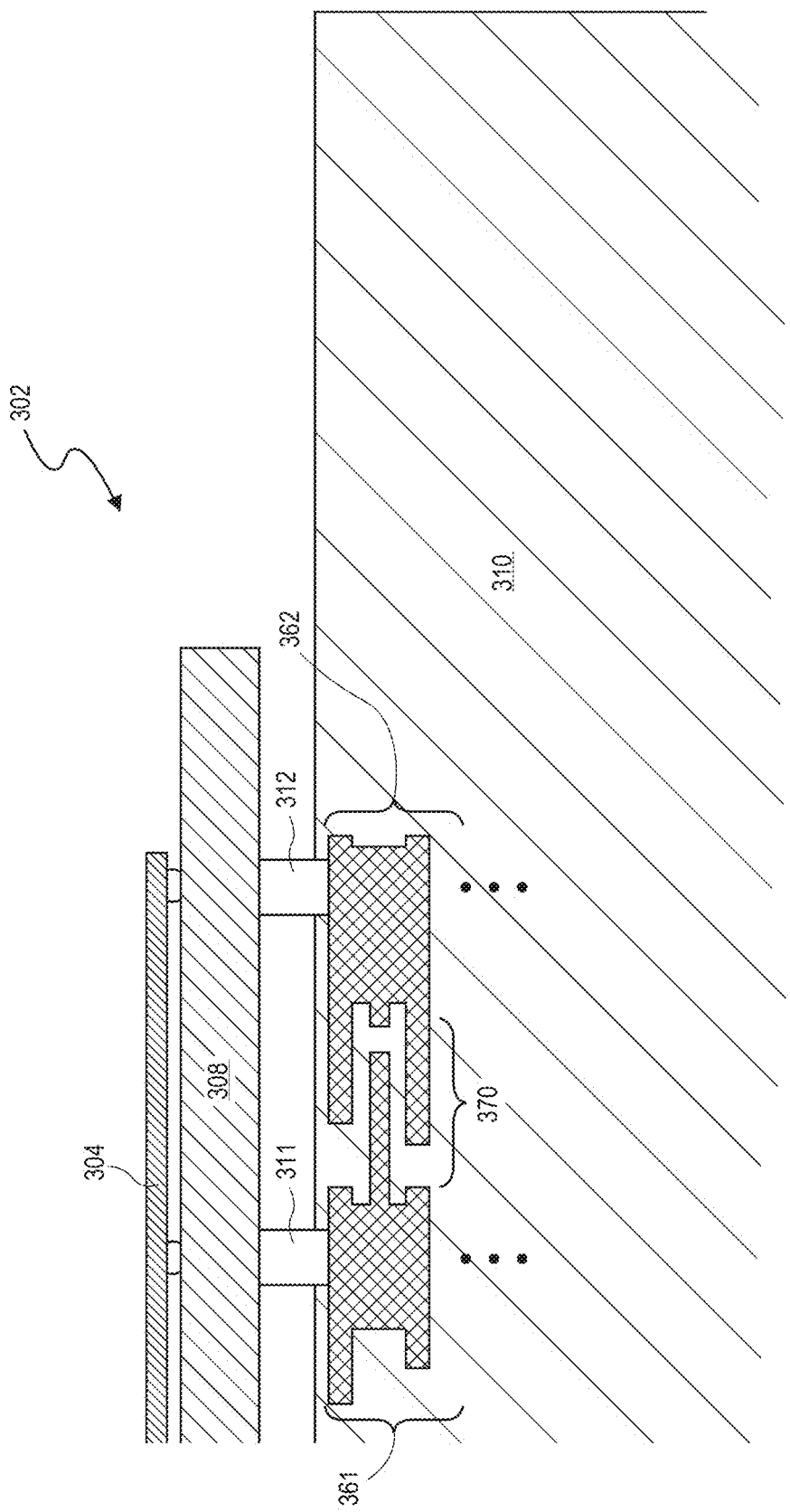

FIGS. 3A and 3B illustrate vertical transitions implemented in a package substrate, an interposer, or a PCB (e.g., motherboard, etc.) forming part of an I/O channel, in accordance with exemplary embodiments. For the exemplary embodiment depicted in FIG. 3A, micro vias are implemented in build-up layers, but they can also be applied in the core layer (e.g. 315) for both PTH and non-PTH based cores. As shown, an integrated system 301 includes an IC chip 304 affixed to a package substrate 308 by first level interconnects (FLI) 305. In embodiments, the IC chip 304 includes a first and second single-ended I/O circuitry (e.g., DDR I/O), each connected to one FLI 305. The package substrate 308 includes a package core 315 with mechanically drilled plated through holes (MTH) 321, 322. On both sides of the core 315 are build up layers 330A, 330B, each of which include a plurality of interconnect metallization layers (e.g., 6-7 metallization layers) separated by intervening dielectric layers (e.g., 5-6 organic layers). In the exemplary embodiment, a first vertical transition includes a first metal-filled micro via stack 331 formed through the build-up layer 330A, which connects with the FLI 305 and connects with a second micro via stack 341 by way of the MTH 321. A second vertical transition connected to the FLI 305 similarly includes first and second micro via stacks 332, 342 connected by the PTH 322. The vertical transitions extend through the second level interconnects (SLI) 311, 312 to a printed circuit board 310. Depending on the embodiment, SLI 311, 312 may be pin sockets (e.g., LGA, PGA, etc.), or any other conventional interconnect. The exemplary embodiment depicted FIG. 3A advantageously maintains substantially the same pattern between the two build-up layers 330A, 330B, which leverages the entire vertical transition length to provide a high mutual capacitance-to-substrate area occupied by the couplers 350 and 355 formed from adjacent interconnect levels (e.g., 351) separately linked by vias (e.g., 360). Of course, single-sided embodiments where a capacitive coupler is formed only in one of the build-up layers 330A or 330B are also possible.

As shown in FIG. 3B, an integrated system 302 includes the IC chip 304 affixed to the package substrate 308, which is in turn affixed to the PCB 310. The PCB 310 further includes vertical transitions 361, 362 connected to the SLI 311 and 312. The vertical transitions 361, 362 further include one or more capacitive coupler 370 occupying an area of the substrate 310 and including overlapping metal surfaces provided by separate (adjacent) interconnect levels in the PCB 310. In one such embodiment, the capacitive coupler 370 is provided along with the capacitive couplers 350 and 355 depicted in FIG. 3A. In other embodiments, only one of the capacitive couplers 350, 355, and 370 is provided between crosstalk susceptible I/O channels.

Figure 4A:
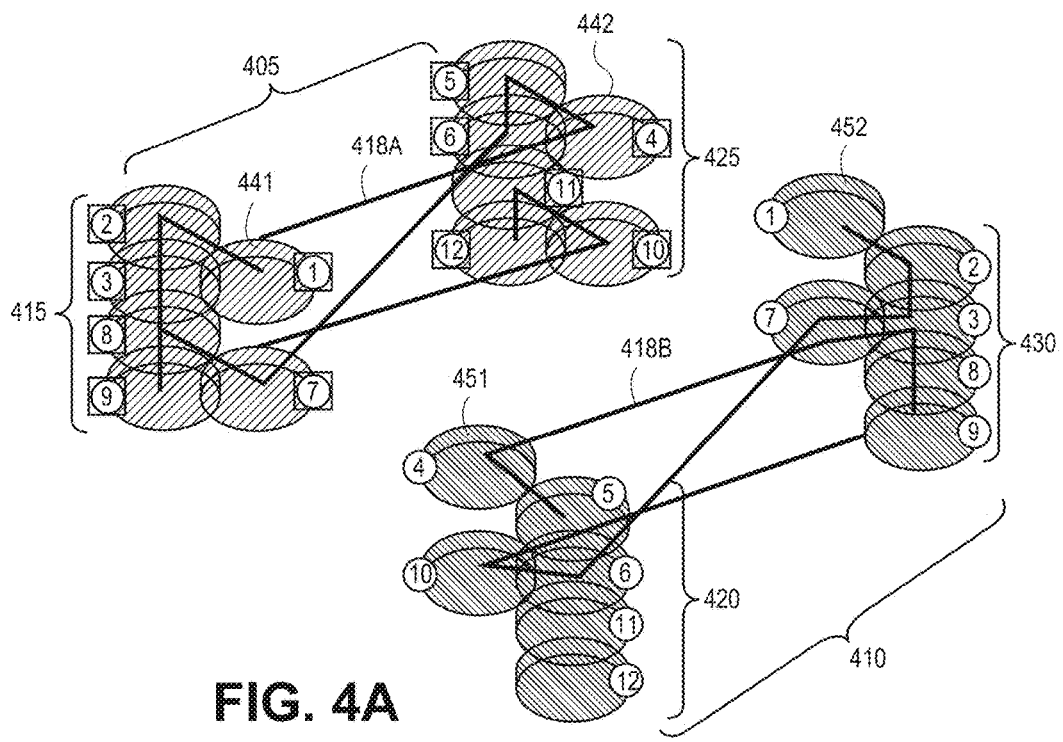
FIGS. 4A and 4B are isometric views illustrating vertical transitions employed in I/O signal routing paths to tune capacitive coupling of channels susceptible to crosstalk, in accordance with an embodiment.
Figure 4B:
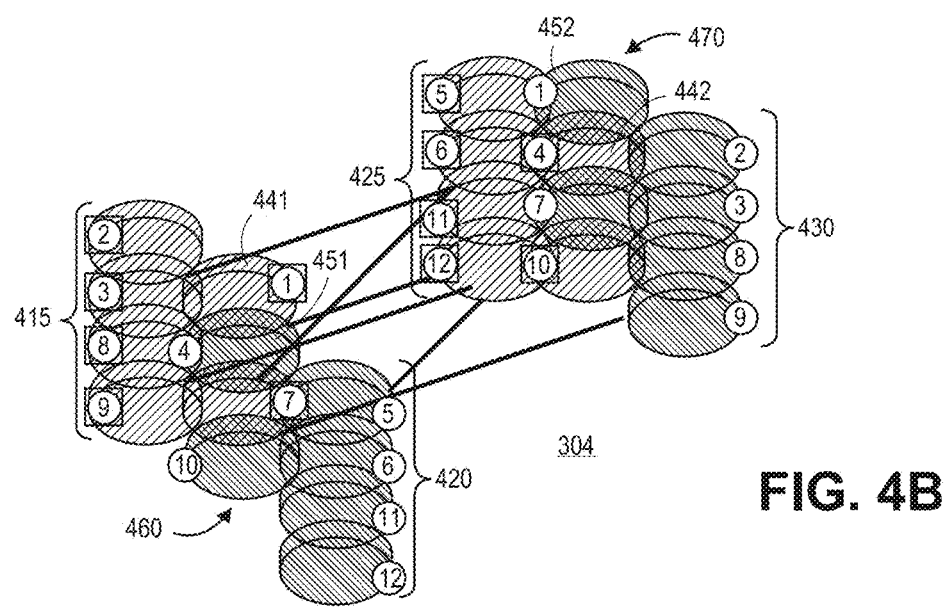

In embodiments, one or more of the overlapping metal surfaces are via pads. Thus, not only may capacitive couplers be formed from the metal patches as depicted in FIGS. 1A-1C, but coupled vertical transitions may also be formed from via pads, for example, as shown in FIGS. 4A and 4B. Indeed, even unlanded vias, if available from a given manufacturing process, may be utilized to fabricate a coupler. FIG. 4A depicts two vertical transitions 405 and 410, each utilizing two sets of via transitions 415, 425 and 420, 430, respectively. Each set of via transitions is linked together by interconnect metallization 418A, 418B such that one signal path includes both of the via transitions in a set. Thus, a first via pad 441 is electrically connected by metal interconnect 418A to a via pad 442 occupying a separate area of a substrate. Similarly a second via pad 451 is electrically connected by metal interconnect 418B to a via pad 452 occupying a separate area of the substrate. Such routing may be done to electrically connect any desired number of via pads, of a fixed or variable via pad diameter, at one or more levels of interconnect. As shown in FIG. 4B, the first set of interconnected via transitions 415, 425 is positioned relative to the second set of interconnected via transitions 420, 430 to have one or more of the via pads 441, 442 overlap an area of the substrate 304 occupied by one or more the via pads 451, 452. In the example illustrated by FIG. 4B, a pair of overlapping vertical capacitive couplers 460, 470 are provided. Each coupler 460, 470 includes multiple vertically interdigitated via pads providing greater mutual capacitance between I/O signal paths employing the transitions.

In further embodiments, one or more pair of capacitively coupled vertical transitions is disposed on a same substrate as other vertical transitions that lack overlapping metal surfaces. In other words, it is not expected that each and every vertical transition of a given substrate will include metal features in an interconnect layer overlapping other metal features in another interconnect layer because not all I/O will have a significant crosstalk aggressor-victim relationship.

While the capacitively coupled vertical transitions described herein may be implemented for a number of high-speed signaling applications, FIG. 5A includes an expanded view 501 of a packaged device 710 illustrating a functional block diagram of a device employing one or more capacitively coupled vertical transitions according to a few advantageous embodiments. FIG. 5B is an isometric view of a server machine employing the system of FIG. 5A, in accordance with an embodiment. FIG. 5C is an isometric view of a mobile computing device employing the system of FIG. 5A, in accordance with an embodiment. Reference numbers in FIGS. 5A, 5B, and 5C are deliberately the same as those used elsewhere herein for those elements/components that may have any of the features previously described in the context of that same reference number.

Referring to FIG. 5A, in one exemplary embodiment the IC chip 304 includes the logic processor core 606, and may be for example a central processing unit (CPU). In an exemplary embodiment, at least one alternate input/output (I/O) interface 607 (e.g., USB, SATA, PCIe, etc.) couples to a memory 602 (e.g., DDR SDRAM) further provided in the system 501 (e.g., on the motherboard 110). In other embodiments, the IC chip 304 is a system-on-a-chip (SoC) including the wireless (RF) module 605 as well as at least one logic processor core 606 (i.e., an applications processor of the system 501). The RF or wireless module 605 is shown in dashed line because it need not be present in all embodiments, although such a module may be found in desktop and server embodiments as well as the more typical mobile device embodiments. The wireless module 605 may be of any design known in the art and, more specifically is operable at a frequency of 0.9 GHz, or higher (e.g., 2.4 GHz). The RF module 605 includes an RF signal receiver (Rx), RF signal transmitter (Tx), or RF signal transceiver (Tx/Rx) with a baseband processor 603 and a front end module (FEM) 604 that further includes a low noise amplifier (LNA) 608 on a receiver path and a power amplifier (PA) 609 on a transmit path, as well as filters, mixers, an up-converter to up convert the signal frequency from baseband to RF band, a down-converter to down convert the signal frequency from RF band to baseband, etc., between the baseband processor 603 and antenna 640.

In embodiments, at least one of the memory 602, logic processor core 606, wireless module 605, and alternate I/O interface 607 is electrically coupled to destinations off the IC chip 304 through an embodiment of the capacitively coupled vertical transitions described herein. For example, a high speed communication link between any two of: the logic processor core 606, memory 602, RF module 605, and alternate I/O interface 607 may be implemented with an embodiment of the capacitively coupled vertical transitions described herein. In one exemplary embodiment where the memory 602 entails a DDR SDRAM (e.g., DDR4 compliant) connected to the board 310 through a DIMM connector, each byte communicated by the memory 602 to the IC chip 304 contains 8 DQ signals driven by either a single-ended or differential driver. With each of the 8 signals divided into two equal groups, good crosstalk cancellation can be achieved between them with the capacitively coupled vertical transitions described herein. With the crosstalk cancellation techniques described herein a higher bandwidth connection is possible between the processor core 606 on the IC chip 304 and SDRAM 602 on the board 310, for example.

In another embodiment also illustrated in FIG. 5A, the LNA 608, or a preamplifier, is connected to differential input signal routing 610A which is routed off the IC chip 304 and onto the package substrate 308. From the package substrate 308, the signal is further routed to an RF signal switch, balun, or a feedline of the antenna 640, for example by routing traces on the PCB 310. An RF signal switch, for example, may include a controlled switch having signal terminals connected to one of the capacitively coupled vertical transitions described herein. In one exemplary embodiment, the LNA input signal routing on the package substrate 308 is implemented with capacitively coupled vertical transitions in conformance with those described elsewhere herein. An analogous transmit path may also be provided with a portion of the on-package transmit path 610B between the PA 609 and the antenna 640 employing an embodiment of the capacitively coupled vertical transitions described herein. In another embodiment where the LNA 608 includes a differential input, capacitively coupled vertical transitions in conformance with the embodiments described herein, are implemented with a balanced pair of signal lines that are electrically coupled to the differential input (e.g., a differential driver).

FIG. 5B is an isometric view of a server machine 800 employing the system 501, in accordance with an embodiment. The mobile computing device or platform 700 may be any computing device configured for data processing and include one or more microprocessor IC chips and one or more memory modules (e.g., SDRAM). With the capacitively coupled vertical transitions described herein, the I/O pin density of the microprocessor IC chip may be increased, and/or a higher bandwidth connection made to the memory module.

FIG. 5C is an isometric view of a mobile computing device 700 employing the system 501, in accordance with an embodiment. The mobile computing device or platform 700 may be any portable device configured for each of electronic data display, electronic data processing, and wireless electronic data transmission. For example, the mobile computing device 700 may be any of a tablet, a smart phone, laptop computer, other intent device, etc. and includes a display screen 705, the system 501, and a battery 713. With the capacitively coupled vertical transitions described herein, the form factor of the packaged system 710 can be reduced relative to convention transmission line circuits, enabling the mobile computing device 700 to either have a concomitantly reduced form factor or a greater region within a given device form factor available to the battery 713 for longest operative lifetimes between charging, or available to memory (not depicted), such as a solid state drive for greatest functionality.

Exemplary embodiments have thus been succinctly described herein. For example, embodiments include a plurality of input/output (I/O) signal paths, the signal paths comprising a first vertical transition through a thickness of a substrate and associated with a first of the I/O signal paths, wherein the first vertical transition comprises a first metal surface occupying a first area of the substrate at a first interconnect level; and a second vertical transition through the thickness of the substrate and associated with a second of the I/O signal paths, wherein the second vertical transition comprises a second metal surface occupying a second area of the substrate at a second interconnect level, adjacent to the first interconnect level, and wherein the first and second areas overlap at least partially to occupy a same first overlapped area of the substrate.

In further embodiments, the first vertical transition comprises a third metal surface occupying a third area of the substrate at a third interconnect level, adjacent to the second interconnect level and on a side of the second metal surface opposite the first metal surface, and the third area overlaps at least a portion of the first substrate area.

In further embodiments, the second vertical transition comprises a fourth metal surface occupying a fourth area of the substrate at a fourth interconnect level, adjacent to the third interconnect level, and the fourth area overlaps, at least partially, the third area to occupy a same second overlapped area of the substrate.

In further embodiments, the first and second overlapped areas overlap to form a vertical stack of features in the first, second, third, and fourth interconnect levels that capacitively couple the first and second I/O signal paths.

In further embodiments, there is a third vertical transition through the thickness of the substrate associated with a third of the I/O signal paths. The third vertical transition comprises a third metal surface occupying a third area of the substrate at one or more of the first and second interconnect levels, and the third area overlaps neither one of the first and second areas. The second vertical transition further comprises a fourth metal surface occupying a fourth area of the substrate at an interconnect level adjacent to one or more of the first and second interconnect levels, and the third and fourth areas overlap at least partially to occupy a same second overlapped area of the substrate.

In further embodiments, the second and third paths are associated with two signal lines having an aggressor-victim relationship, and wherein the second overlapped area is associated with a mutual capacitive coupling between the second and third vertical transitions through an intervening dielectric disposed between the third and fourth metal surfaces.

In further embodiments, the first and second vertical transitions each comprise metal-filled vias through a package or printed circuit board (PCB) substrate.

In further embodiments, the first metal surface comprises a first via pad and wherein the second metal surface comprises a second via pad.

In further embodiments, the first via pad is electrically connected by metal interconnect to a third via pad occupying a third area of the substrate not overlapping the first area; the second via pad is electrically connected by metal interconnect to a fourth via pad occupying a fourth area of the substrate not overlapping the second area; and the third and fourth areas overlap.

In further embodiments, the first of the I/O signal paths comprises a first plated via electrically connected the first via pad by metal interconnect and the first plated via does not overlap the first area; and the second of the I/O signal paths comprises a second plated via electrically connected the second via pad by metal interconnect, and the second plated via does not overlap the second area.

In embodiments, a system comprises at least one of an integrated circuit (IC) package substrate, or a printed circuit board (PCB) substrate; and a plurality of input/output (I/O) signal paths, further comprising: a first vertical transition through a thickness of a substrate and associated with a first of the I/O signal paths, wherein the first vertical transition comprises a first metal surface at a first interconnect level and occupying a first area of the substrate adjacent to the first vertical transition; and comprising a second vertical transition through the thickness of the substrate and associated with a second of the I/O signal paths, wherein the second vertical transition comprises a second metal surface occupying a second area of the substrate at a second interconnect level, adjacent to the first interconnect level, and wherein the first and second areas overlap at least partially to occupy a same first overlapped area of the substrate, wherein the first vertical transition extends through a first metal filled via in the IC package substrate or the PCB substrate and the second vertical transition extends through a second metal filled via in the IC package substrate or the PCB substrate.

In further embodiments, the first and second vertical transitions extend through an IC package substrate; wherein the first of the plurality of I/O paths further comprises: a third vertical transition through a thickness of the PCB substrate, wherein the third vertical transition comprises a third metal surface occupying a first area of the PCB substrate at a first PCB interconnect level; and wherein the second of the plurality of I/O paths further comprises: a fourth vertical transition through the thickness of the PCB substrate, wherein the fourth vertical transition comprises a fourth metal surface occupying a second area of the PCB substrate at a second PCB interconnect level, adjacent to the first PCB interconnect level, and wherein the first and second PCB areas overlap at least partially to occupy a same first overlapped area of the PCB substrate.

In further embodiments, the system further comprises an IC chip affixed to the IC package substrate, wherein the IC package is coupled to the PCB through a socket contact, wherein the first and second paths are to carry crosstalking communication signals having an aggressor-victim relationship, and wherein the first overlapped area imparts a mutual capacitive coupling between the first and second vertical transitions that reduces the crosstalk.

In further embodiments, the IC chip comprises at least one logic processor core, wherein the PCB hosts at least one dynamic random-access memory (DRAM), and wherein the crosstalking communication signals are carried by single-ended circuitry coupled to the DRAM.

In further embodiments, the IC chip comprises at least one wireless module, wherein the PCB hosts at balun, and wherein the crosstalking communication signals are carried by differential circuitry coupled to the balun.

In embodiments, a method of fabricating circuitry for coupling a first and second input/output (I/O) channel of an integrated circuit (IC) disposed on a chip to an off-chip connection point, the method comprises: forming a first vertical transition through a thickness of a substrate and associated with the first I/O channel, wherein the first vertical transition comprises a first metal surface occupying a first area of the substrate at a first interconnect level; forming a second vertical transition through the thickness of the substrate and associated with the second I/O channel, wherein the second vertical transition comprises a second metal surface occupying a second area of the substrate at a second interconnect level, adjacent to the first interconnect level, and wherein the first and second areas overlap at least partially to occupy a same first overlapped area of the substrate.

In further embodiments, forming the first and second vertical transitions comprises: forming a pair of vertically stacked, or staggered, vias through the substrate with overlapping metal regions extending off the first and second vias.

In further embodiments, the overlapping metal regions occupy an area of the substrate between the first and second vias.

In further embodiments, forming the first vertical transition further comprises forming the first via and a third vertically stacked, or staggered, via through the substrate; wherein forming the second vertical transition further comprises forming the second via and a fourth vertically stacked, or staggered, via through the substrate; and wherein forming the overlapping metal stubs further comprises forming overlapping via pads, each via pad electrically connected to one of the first, second, third, or fourth via.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A system comprising:
a first vertical transition through a thickness of a substrate and associated with a first of a plurality of I/O signal paths, wherein the first vertical transition comprises a first metal surface at a first interconnect level, the first metal surface occupying a first area of the substrate adjacent to the first vertical transition;
a second vertical transition through the thickness of the substrate and associated with a second of the plurality of I/O signal paths, wherein the second vertical transition comprises a second metal surface occupying a second area of the substrate at a second interconnect level, immediately adjacent to the first interconnect level, and wherein the first and second areas overlap at least partially to occupy a same first overlapped area of the substrate;
a third vertical transition through the thickness of the substrate and associated with a third of the I/O signal paths, wherein the third vertical transition comprises a third metal surface occupying a third area of the substrate at one or more of the first and second interconnect levels, and wherein the third area overlaps neither one of the first and second areas; and
wherein the second vertical transition further comprises a fourth metal surface occupying a fourth area of the substrate at an interconnect level adjacent to one or more of the first and second interconnect levels, and wherein the third and fourth areas overlap at least partially to occupy a same second overlapped area of the substrate.

2. The system of claim 1, wherein the first vertical transition comprises a third metal surface occupying a third area of the substrate at a third interconnect level, adjacent to the second interconnect level and on a side of the second metal surface opposite the first metal surface, and wherein the third area overlaps at least a portion of the first substrate area.

3. The system of claim 1, wherein the second and third paths are associated with two signal lines having an aggressor-victim relationship, and wherein the second overlapped area is associated with a mutual capacitive coupling between the second and third vertical transitions through an intervening dielectric disposed between the third and fourth metal surfaces.

4. The system of claim 1, wherein the first and second vertical transitions each comprise metal-filled vias through the substrate.

5. The system of claim 1, wherein the first and second paths are associated with two signal lines having an aggressor-victim crosstalk relationship and wherein the first overlapped area is associated with a mutual capacitive coupling between the first and second vertical transitions through an intervening dielectric disposed between the first and second metal surfaces.

6. The system of claim 2, wherein the second vertical transition comprises a fourth metal surface occupying a fourth area of the substrate at a fourth interconnect level, adjacent to the third interconnect level, and wherein the fourth area overlaps, at least partially, the third area to occupy a same second overlapped area of the substrate.

7. The system of claim 2, wherein the first and second overlapped areas overlap to form a vertical stack of features in the first, second, third, and fourth interconnect levels that capacitively couple the first and second 1/0 signal paths.

8. The system of claim 4, wherein the first metal surface comprises a first via pad and wherein the second metal surface comprises a second via pad.

9. A system comprising:
a first vertical transition through a thickness of a substrate and associated with a first of a plurality of I/O signal paths, wherein the first vertical transition comprises a first metal surface at a first interconnect level, the first metal surface occupying a first area of the substrate adjacent to the first vertical transition; and
a second vertical transition through the thickness of the substrate and associated with a second of the plurality of I/O signal paths, wherein the second vertical transition comprises a second metal surface occupying a second area of the substrate at a second interconnect level, immediately adjacent to the first interconnect level, and wherein the first and second areas overlap at least partially to occupy a same first overlapped area of the substrate, wherein the first metal surface comprises a first via pad and wherein the second metal surface comprises a second via pad, wherein the first and second vertical transitions each comprise metal-filled vias through the substrate,
wherein the first via pad is electrically connected by metal interconnect to a third via pad occupying a third area of the substrate not overlapping the first area;
wherein the second via pad is electrically connected by metal interconnect to a fourth via pad occupying a fourth area of the substrate not overlapping the second area; and
wherein the third and fourth areas overlap.

10. The system of claim 9, wherein the first of the 1/0 signal paths comprises a first plated via electrically connected the first via pad by metal interconnect and wherein the first plated via does not overlap the first area; and wherein the second of the 1/0 signal paths comprises a second plated via electrically connected the second via pad by metal interconnect, and wherein the second plated via does not overlap the second area.

11. A system comprising:
an integrated circuit (IC) package substrate and a printed circuit board (PCB) substrate; and
a plurality of input/output (I/O) signal paths, comprising:
a first vertical transition through a thickness of the IC package substrate and associated with a first of the I/O signal paths, wherein the first vertical transition comprises a first metal surface at a first interconnect level and occupying a first area of the IC package substrate adjacent to the first vertical transition; and
a second vertical transition through the thickness of the IC package substrate and associated with a second of the I/O signal paths, wherein the second vertical transition comprises a second metal surface occupying a second area of the IC package substrate at a second interconnect level, immediately adjacent to the first interconnect level, and wherein the first and second areas overlap at least partially to occupy a same first overlapped area of the IC package substrate, wherein the first vertical transition extends through a first metal filled via in the IC package substrate and the second vertical transition extends through a second metal filled via in the IC package substrate or the PCB substrate, wherein the first of the plurality of I/O paths further comprises:
a third vertical transition through a thickness of the PCB substrate, wherein the third vertical transition comprises a third metal surface occupying a first area of the PCB substrate at a first PCB interconnect level; and
wherein the second of the plurality of I/O paths further comprises:
a fourth vertical transition through the thickness of the PCB substrate, wherein the fourth vertical transition comprises a fourth metal surface occupying a second area of the PCB substrate at a second PCB interconnect level, adjacent to the first PCB interconnect level, and wherein the first and second PCB areas overlap at least partially to occupy a same first overlapped area of the PCB substrate.

12. The system of claim 11, further comprising an IC chip affixed to the IC package substrate, wherein the IC package is coupled to the PCB through a socket contact, wherein the first and second paths are to carry crosstalking communication signals having an aggressor-victim relationship, and wherein the first overlapped area imparts a mutual capacitive coupling between the first and second vertical transitions that reduces the crosstalk.

13. The system of claim 12, wherein the IC chip comprises at least one logic processor core, wherein the PCB hosts at least one dynamic random-access memory (DRAM), and wherein the crosstalking communication signals are carried by single-ended circuitry coupled to the DRAM.

14. The system of claim 12, wherein the IC chip comprises at least one wireless module, wherein the PCB hosts at balun, and wherein the crosstalking communication signals are carried by differential circuitry coupled to the balun.

* * * * *